United States Patent
Gao (10) Patent No.: US 11,445,635 B2
(45) Date of Patent: Sep. 13, 2022

(54) COOLING LOOPS FOR BUFFERING COOLING CAPACITY VARIATIONS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/082,692

(22) Filed: Oct. 28, 2020

(65) Prior Publication Data
US 2022/0095492 A1 Mar. 24, 2022

Related U.S. Application Data (60) Provisional application No. 63/082,671, filed on Sep. 24, 2020.

(51) Int. Cl.
H05K 7/20 (2006.01)
(52) U.S. Cl.
CPC ......... *H05K 7/20327* (2013.01); *H05K 7/208* (2013.01); *H05K 7/20272* (2013.01); *H05K 7/20763* (2013.01)
(58) Field of Classification Search
CPC ............. H05K 7/2079; H05K 7/20827; H05K 7/20272; H05K 7/20327
See application file for complete search history.

(56) References Cited

U.S. PATENT DOCUMENTS

| | | | | |
|---|---|---|---|---|
| 5,293,754 A | * | 3/1994 | Mizuno | H01L 23/473 165/104.27 |
| 5,375,650 A | * | 12/1994 | Mizuno | H05K 7/20281 165/104.33 |
| 7,270,174 B2 | * | 9/2007 | Chu | H05K 7/2079 165/11.1 |
| 11,133,705 B2 | * | 9/2021 | Ross | G05B 19/054 |
| 2018/0054919 A1 | * | 2/2018 | Yoshikawa | H05K 7/20827 |

FOREIGN PATENT DOCUMENTS

CN 104377884 A * 2/2015
WO WO-2015049807 A1 * 4/2015 ......... H05K 7/20809

* cited by examiner

*Primary Examiner* — Zachary Pape
(74) *Attorney, Agent, or Firm* — Womble Bond Dickinson (US) LLP (57) ABSTRACT

In one embodiment, a cooling system for buffering cooling capacity variations and heat load variations includes a buffering unit with a fluid container and a gas container; and a multi-way valve positioned between a fluid inlet and the buffering unit. The multi-way valve can operate to form multiple fluid loops, which include a fluid loop through the fluid container. When the cooling system in an under-provision period, the buffering unit can store a portion of fluid to the fluid container. When the cooling system is in an over-provision period, fluid stored in an under-provision period can be discharged from the fluid container due to gas pressure in the gas container reaching a threshold.

20 Claims, 6 Drawing Sheets

COOLING LOOPS FOR BUFFERING COOLING CAPACITY VARIATIONS

RELATED APPLICATIONS

This application claims the benefit of U.S. Provisional Application No. 63/082,671, filed Sep. 24, 2020, which is incorporated by reference herein in its entirety.

FIELD OF THE INVENTION

Embodiments of the present disclosure relate generally to airflow management in a data center. More particularly, embodiments of the disclosure relate to a buffering unit for buffering cooling capacity variations in a cooling system used with an information technology (IT) server or an IT rack.

BACKGROUND

With the booming of AI applications, high performance computing, cloud computing and data-driven applications, data centers as well as the compute and storage infrastructures have becoming increasingly critical for a company to maintain its competitive edges. Maintaining a data center and compute and storage infrastructure is expensive and part of the expenses is related to cooling the data center.

One of the major challenges in cooling a data center is to maintain a balance between the cooling capacity of a cooling system and the heat removal requirement of the data center. If the cooling capacity exceeds the heat removal requirement, some cooling capacity would be wasted, thereby increasing cooling cost and reducing cooling efficiency. On the other hand, if the cooling capacity is less than the heat removal requirement, the data center may not be sufficiently cooled. Designing a cooling system that provides just enough cooing capacity to remove the heat removal requirement is difficult, because the thermal load in a data center may vary based on factors that are hard to predict, for example, a sudden and unexpected spike in workload. The scenario becomes more critical with the increasing power density of the electronics component deployed in the data centers.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiments, described herein are systems and methods for buffering cooling capacity variations in a cooling system. In one embodiment, a cooling system for buffering cooling capacity variations includes a buffering unit with a fluid container; and a multi-way valve positioned between a fluid inlet and the buffering unit. The multi-way valve can operate to form multiple fluid loops, which include a buffering fluid loop passing through the fluid container. When the cooling system in an under-provision period, the buffering unit can store cooling fluid in the buffering fluid loop to the fluid container. Fluid previously stored in an under-provision period can be discharged when the cooling system is in an over-provision period.

In one embodiment, the buffering unit is fully sealed, and can further include a gas container that is separated from the fluid container by a physical divider. The physical divider is a physical layer that can be moved under pressure either vertically or horizontally but not both, to cause the size of either the gas container or the fluid container to expand. The gas container can include a heat exchanger integrated therewith.

In one embodiment, the cooling system can further include a heat exchanger outside the buffering unit. This heat exchanger can function as a liquid-to-liquid exchanger, liquid-to-air exchanger or a fluid phase condenser. A discharging valve can be positioned between this heat exchanger and the buffering unit. The discharging valve can be turned on or turned off based on the gas pressure in the gas container. When the discharge valve is turned on, fluid can be discharged via the discharging valve to the heat exchanger outside the buffering unit.

In one embodiment, the cooling system can further include a fluid loop through the heat exchanger in the buffering unit for heating the gas, and a direct fluid loop that extends from the multi-way valve to the heat exchanger outside the buffering unit. The direct fluid loop can further pass through an information technology (IT) server or an IT rack and return to the multi-way valve to form a complete fluid circuit. The heating fluid loop is also a complete fluid circuit, and can be used to heat up the gas in the gas container to change the gas pressure in the gas container.

In one embodiment, when the cooling system in the under-provision period, cooling capacity configured for the cooling system cannot meet the requirement for removing a desired amount heat from an IT server or IT rack. When the cooling system is in an over-provision period, more cooling capacity is provided than needed for removing the desired amount of heat from the IT server or IT rack. One or more sensors and one or more system functions can be used to determine whether the cooling system in the under-provision period or in the over-provision period.

In one embodiment, when the cooling system is in the under-provision period, the buffering fluid loop is open up to the discharging valve, the heating fluid loop is closed, and the direct fluid loop is open to form a complete fluid circuit. Fluid stored to the fluid container can add to existing fluid therein, and cause the total volume of fluid in the fluid container to increase. The increased volume can push the physical divider towards the gas container, causing a pressure of gas in the gas container to increase. When the gas pressure reaches a threshold, the controlling valve can close the buffering fluid loop, and therefore no more fluid will be stored to the fluid container. Fluid in the direct fluid loop can flow to the heat exchanger outside the buffering unit. At this heat exchanger, the fluid is cooled by a primary loop and then returns to an information technology (IT) server or an IT rack.

In one embodiment, when the cooling system is the over-provision period, the buffering fluid loop is open up to the discharging valve, the heating fluid loop is open to form a complete fluid circuit, and the direct fluid loop is closed, or partially open. Fluid in the heating fluid loop can heat up gas in the gas container to cause a pressure of the gas in the gas container to increase to a threshold, which is higher than the threshold used for closing the buffering fluid loop. The increased gas pressure can cause the discharging valve to be turned on, and simultaneously push the physical divider towards the fluid container to force out a portion of the stored fluid. The forced-out fluid can pass through the turned-on discharging valve, and converge with fluid from the heating fluid loop. The converged fluid can pass through the heat exchange outside the buffering unit and return to an information technology (IT) server or an IT rack.

In one embodiment, the heat exchanger outside the buffering unit can be positioned at a predetermined height above the buffering unit. If fluid entering into the cooling system from the IT server or IT rack is vapor, at least a portion of the vapor can pass through the buffering unit to converge with a portion of the vapor in the direct fluid loop. The converged vapor can rise up to the heat exchanger, which condenses the converged vapor to cooling liquid. The cooling liquid can fall into the IT server or the IT rack due to gravity.

In one embodiment, if fluid entering into the cooling system from the server or IT rack is cooling liquid, at least a portion of the cooling liquid can pass through the buffering unit and converge with a portion of the cooling liquid discharged from the fluid container. The converged cooling liquid can be pushed up by a pump to the heat exchanger outside the buffering unit. At this heat exchanger, the converged cooling liquid can be cooled by a primary loop, and fall into the IT server or the IT rack due to gravity.

In one embodiment, the buffering fluid loop can have a discharging section, which may have a larger diameter than the rest of the loop, or may be positioned in an inclined manner, to facilitate the discharging of stored fluid. The buffering unit may include a pressure sensor for measuring gas pressure in the buffering unit.

Compared to existing cooling systems, the cooling systems described above can handle cooling capacity variations in a system when a multiple phase fluid is used. Further, the cooling systems can use different types of fluids for cooling, can use physical properties/gravity to regulate fluids in the systems without relying on pumps. In the above-described embodiments, a pressured-based fluid valve is used for system control.

Thus, the cooling systems described in this disclosure can use multiple phase fluids, including liquid, gas as well as phase change fluid. Advantages of the cooling systems include improving cooling efficiency to IT racks that experience variations in heat loads and/or cooling capacities, IT loads, and cooling conditions; simplifying the design of a cooling system using multiple fluid circuits; and enabling the cooling systems to be self-regulated, thereby reducing design capital costs.

The above description does not include an exhaustive list of all embodiments in this disclosure. All systems and methods can be practiced from all suitable combinations of the various aspects and embodiments described in the disclosure.

The following description and drawings are illustrative and are not to be construed as limiting. Numerous specific details are described to provide a thorough understanding of various embodiments. However, in certain instances, well-known or conventional details are not described in order to provide a concise discussion of embodiments.

Figure 1:
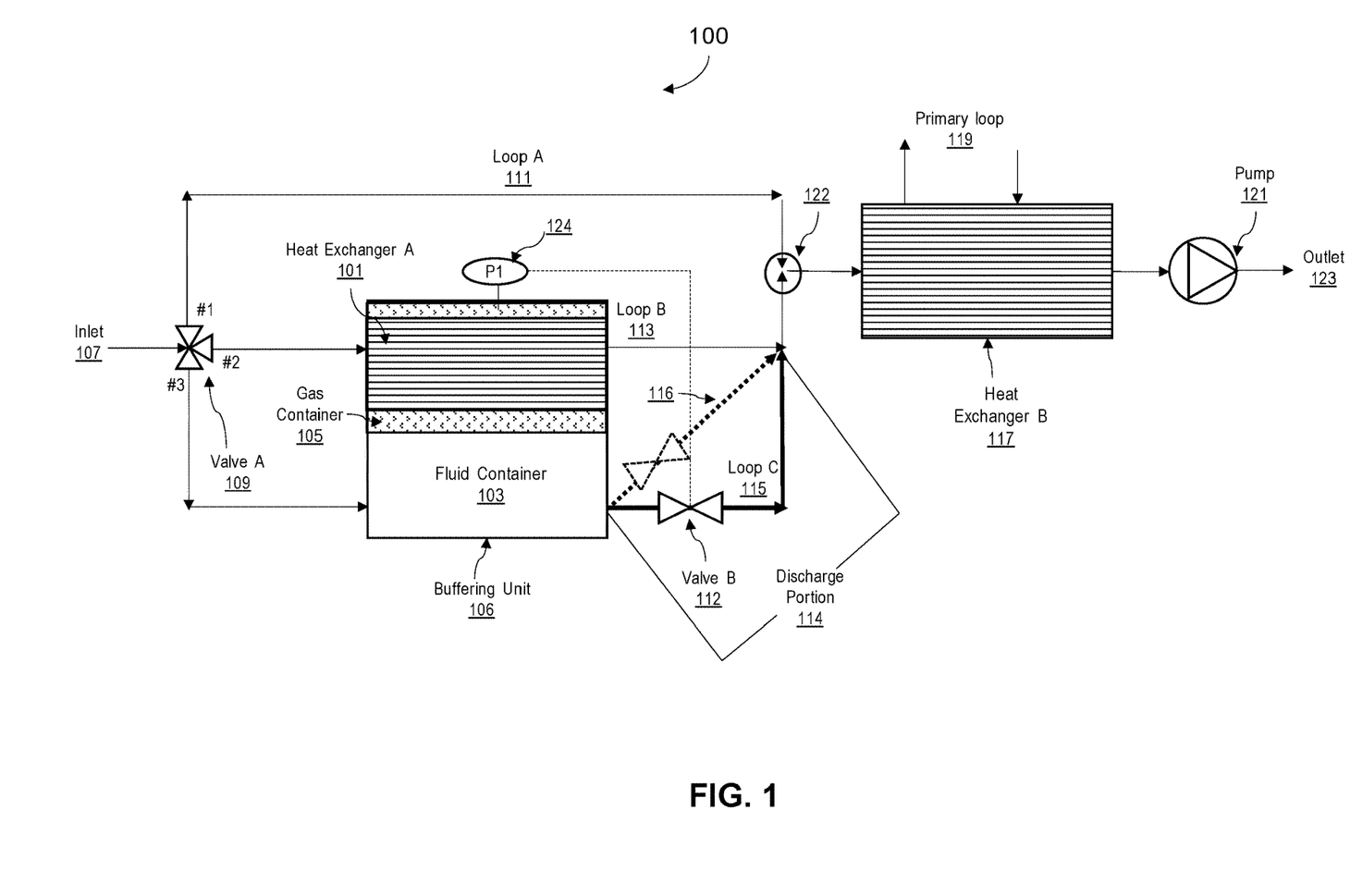
FIG. 1 illustrates a cooling system with a buffering unit according to one embodiment.

FIG. 1 shows a cooling system 100 with a buffering unit 106 according to one embodiment. As shown in the figure, the cooling system 100 includes heat exchanger A 101 and heat exchanger B 117. Heat changer A 101 can be embedded in a gas container 105, which is part of the buffering unit 106. Heat exchanger A 101 may be heating/cooling coils compacted in the gas container 105, which include gas whose pressure is highly sensitive to temperature changes. One example of the gas can be nitrogen gas. In one embodiment, heat exchanger A 101 is used as a heating unit to heat the gas to a higher temperature to increase its pressure.

In one embodiment, the buffering unit can further include a fluid container 103. The buffering unit itself can be container that is fully sealed-off, and that is separated into the gas container 105 and the fluid container 103 by a physical layer. In one embodiment, the physical layer can be understood as the flexible physical layer of the gas container. The physical layer can function as a movable physical divider which can be moved up vertically or horizontally depending on the orientation of the buffering unit, but not both horizontally and vertically. The movable physical layer allows the volume sizes/regions of both the gas container 105 and the fluid container 103 to be adjustable.

For example, in one embodiment, if the physical layer moves up, the size of the gas container 105 would be reduced, and accordingly, the size of the fluid container 103 would be enlarged. As the gas container shrinks, one of its boundaries, i.e., the physical layer, moves up. When the physical layer moves down, the size of the gas container 105 would be enlarged, and the size of the fluid container 103 would decrease.

In one embodiment, the cooling system 100 can further include valve A 109, and valve B 112. Valve A 109 can be a multi-way controlling valve, for example, either a three-way valve or a two-way valve depending on the number of fluid loops needed for the cooling system 100. Valve B 112 is two-way valve that is connected to the fluid container 103 and functions as a discharging valve for discharging a portion of stored fluid in the fluid container 103. The fluid in the fluid container 103 can be liquid, vapor, or a combination of liquid and vapor.

In one embodiment, valve A 109 is a three-way valve, which operates to create three individual fluid loops 111, 113, and 115. Loop A 111 connects an inlet 107 and heat exchanger B 117, which allows fluid (e.g., cooling liquid or vapor or a combination thereof) from an IT server or IT rack to enter the cooling system 100. Heat exchanger B can be a liquid-to-liquid exchanger where the fluid releases heat to a primary loop 119, an air cooled exchanger, or a condenser that can condense vapor into cooling liquid.

In one embodiment, fluid loop A 111 is a direct fluid loop that provides a direct connection between the inlet 107 and heat exchanger B 117 without using any additional component. As such, fluid loop A 111 can have a low resistance to the fluid such that fluid loop A 111 can transmit fluid faster.

In one embodiment, fluid loop B 113 is a heating fluid loop that connects the inlet 107, heat exchanger A 101, and heat exchange B 117. One of the functions of loop B 113 is to direct fluid from the inlet 107 to heat exchanger A 101, where a portion of the heat in the fluid is transferred to gas in a gas container 105, thereby heating up the gas. The fluid in fluid loop B 113 can then flow to heat exchanger B 117, where heat of the fluid is released to the primary loop 119.

In one embodiment, fluid loop C 115 is a buffer fluid loop that connects the fluid inlet 107, the fluid container 103, valve B 112, and heat exchanger B 117. A discharging section 114 of fluid loop C 115 can have a large diameter than the rest of the loop 115, or be positioned in an inclined manner 116 to facilitate the discharging of fluid from the fluid container 103.

In one embodiment, a pressure sensor 124 can be used to measure the pressure of gas in the gas container 105. The gas pressure can be used to control valve A 109 and valve B 112. For example, the cooling system can use two thresholds to control valve A 109 and valve B respectively, and one of the thresholds is higher than the other.

In one embodiment, when the cooling system is in an under-provision period, which means that the cooling capacity of the cooling system 100 is not sufficient to remove thermal load in the cooling system 100 to reduce its temperature to a predetermined level, the buffering unit 106 can be used to store a portion of fluid and the corresponding thermal energy contained within the fluid to buffer the variation.

As an example implementation, the cooling system 100 can check the gas pressure in the gas container 105 periodically, and can keep valve B 112 closed, and keep valve A 109 open before the gas pressure reaches the lower threshold, so that fluid in fluid container 103 can be stored to the fluid container 103. In the under-provision period, fluid loop B 113 is closed, and fluid loop A is open to form a complete fluid circuit. A complete cooling circuit in this disclosure means that the fluid loop connects the inlet 107 and heat exchanger B 117, and connects back to the inlet 107 after passing through the IT server or IT rack. In some embodiments, a complete fluid loop may also pass through the buffering unit 106.

In one embodiment, in the under-provision period, as more fluid is being stored to the fluid, the volume of the fluid in the fluid container 103 keeps increasing, and the increasing volume may exert a pushing force on the physical layer separating the gas container 105 and the fluid container 103. The pushing force can reduce the size of the gas container 105, and thus increase the gas pressure in the gas container 105. When the gas pressure reaches the lower threshold, the cooling system 100 can close fluid loop C 115 at valve A 109, which will prevent additional fluid to be stored to the fluid container 103.

In one embodiment, when the cooling system is in an over-provision period, which means that the cooling capacity configured for the cooling system 100 is higher than the heat removal requirement, the cooling system 100, fluid loop A 111 may be fully closed, and fluid loop B 113 is open, and fluid loop C 115 is open up to the point of valve B 112. Heat in fluid loop B 113 can be partially transferred to the gas in the gas container 105, which causes gas pressure of the gas container 105 to increase. The pressure increase 124 in the gas container 105 triggers the opening of valve B 113, for an example, by decreasing the open pressure of valve B 112. The decreased open pressure of valve B may make valve B 112 easier to open, and the pressure increase of the gas in the gas container can push the physical layer in the buffering unit 106 towards the fluid container 103 to discharge a portion of the fluid therein through valve B 112.

As further shown in FIG. 1, a pump 121 can be used in some scenarios for pumping fluid in the cooling system 100 to an outlet 123 or to the primary loop 119. The pump 121 can be located between heat exchanger B 117 and the outlet 113 or between exchange exchanger B 117 and a point 122.

Figure 2:
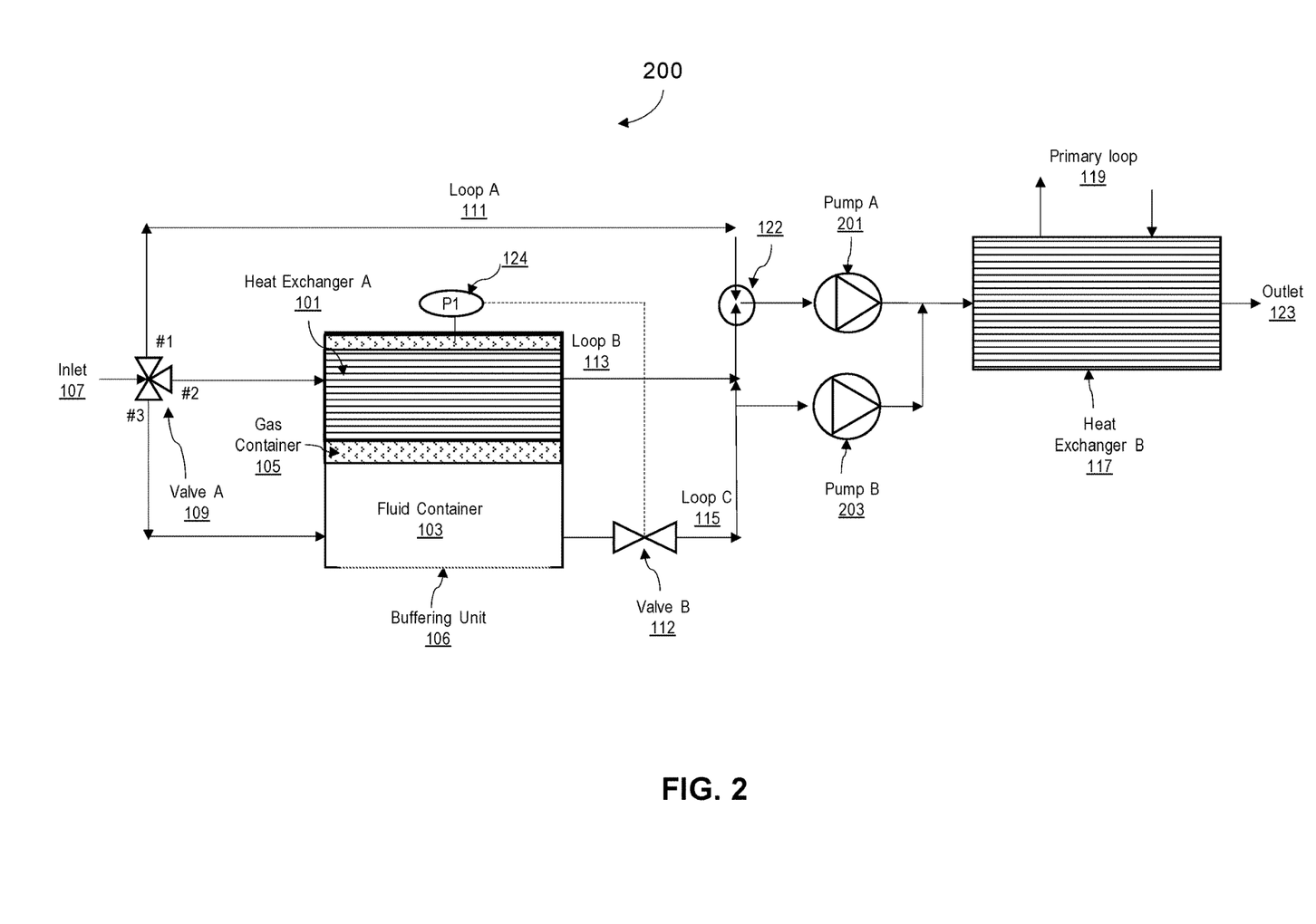
FIG. 2 illustrates a cooling system with multiple pumps according to one embodiment.

FIG. 2 illustrates a cooling system 200 with multiple pumps according to one embodiment. As shown in FIG. 2, pump A 201 and pump B 203 are used in the cooling system. Pump A 201, which is less powerful than pump B 203, can be used primarily by fluid loop A 111, where fluid may encounter lower resistance due to the lack of physical components on the loop. Pump B 203, on the other hand, is more powerful than pump A 201, and is used primarily by fluid loop B 113 and fluid loop C 115 to overcome higher resistance. The higher resistance in the loops is due to the buffering unit 106. The two pumps 201 and 203 can be arranged in a distributed redundant mode or in a reserved mode. In another embodiment, the two pumps can be operated in a combination mode for maximizing energy efficiency.

In one embodiment, in the distributed redundant mode, both pumps 201 and 203 can be used in parallel and the failure of either pump would force the working pump to take over all the pumping load. In the reserved mode, only one pump is being used at any particular point of time. The other pump will be activated only when the pump being used encounters a failure.

Figure 3:
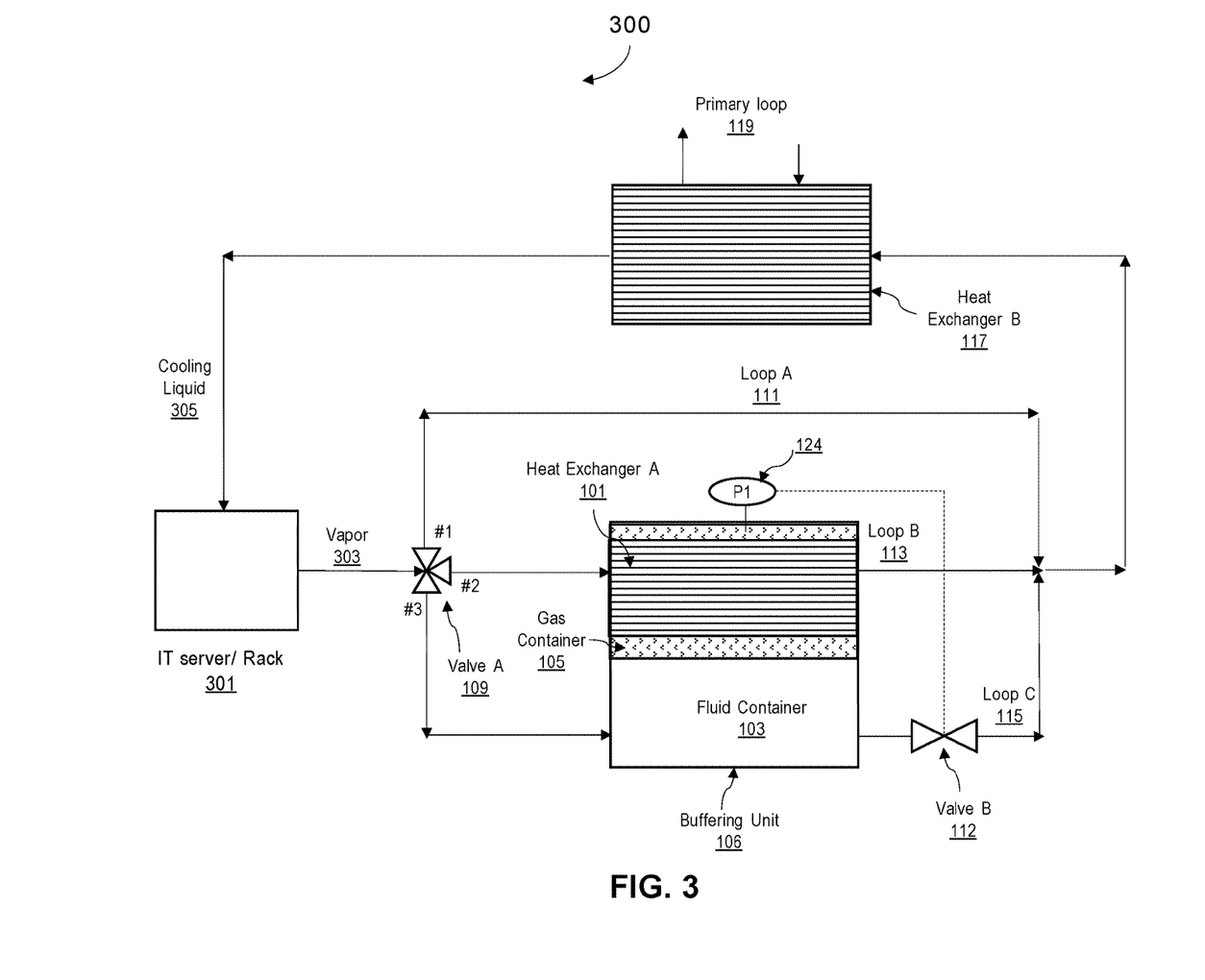
FIG. 3 illustrates a cooling system with multiple phase fluid according to one embodiment.

FIG. 3 illustrates a cooling system 300 with multiple phase fluid according to one embodiment. More specifically, this embodiment utilizes thermosiphon to regulate the temperature of an IT server/rack 301.

In one embodiment, phase change cooling fluid coming out of the IT server/rack 301 is heated to vapor 303. When the cooling system is in an under-provision period, a portion of the vapor can be temporarily stored to the fluid container 103, while a portion of the vapor can rise up to heat exchanger B 117. When the cooling system is in an over-provision period, the previously stored vapor can be discharged via valve B 112 and loop C, and converge with vapor in the fluid loop 113. The converged vapor can the rise up to heat exchanger B 117.

In one embodiment, heat exchanger B 117 can function as a condenser to condense the vapor reaching heat exchanger B 117 to liquid phase as cooling liquid 305, which falls into the IT server/rack 303 due to gravity.

Figure 4:
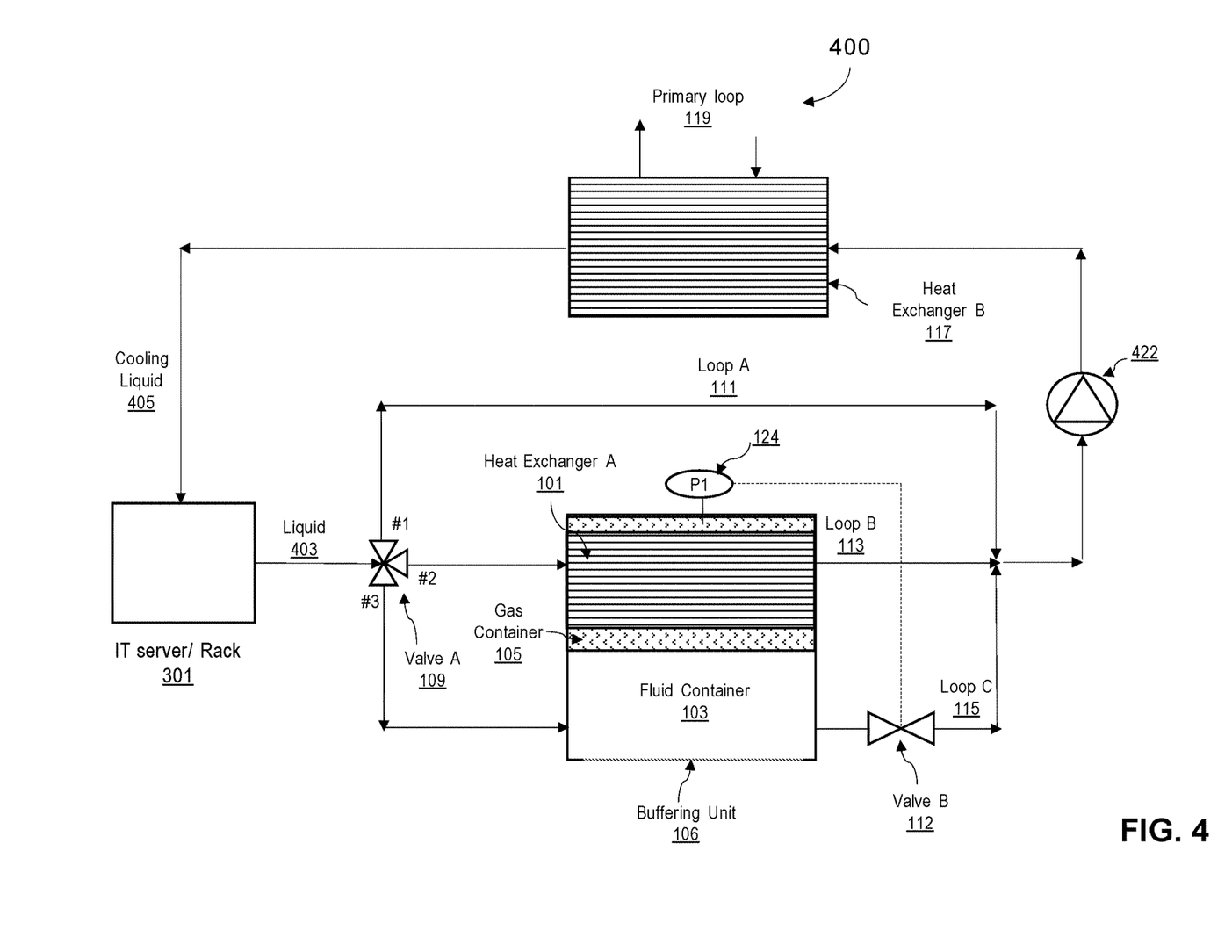
FIG. 4 illustrates a cooling system with single phase fluid according to one embodiment.

FIG. 4 shows a cooling system 400 with single phase fluid according to one embodiment. In this embodiment, the cooling system 400 uses single phase fluid 403 to cool the IT server/rack 301. In this embodiment, a pump 422 is used to pump cooling liquid from one or more of the fluid loops 111, 113 and 115 up to heat exchanger B 117, as cooling liquid cannot rise up like vapor.

Heat exchanger B 117 can function as a liquid-to-liquid heat exchanger or a heat exchanger cooled by cooling air. After passing through heat exchanger B 117, the temperature of the liquid is reduced with additional cooling from the primary loop 119. Cooling liquid 405 is then pumped back to the IT server/rack 301.

Figure 5:
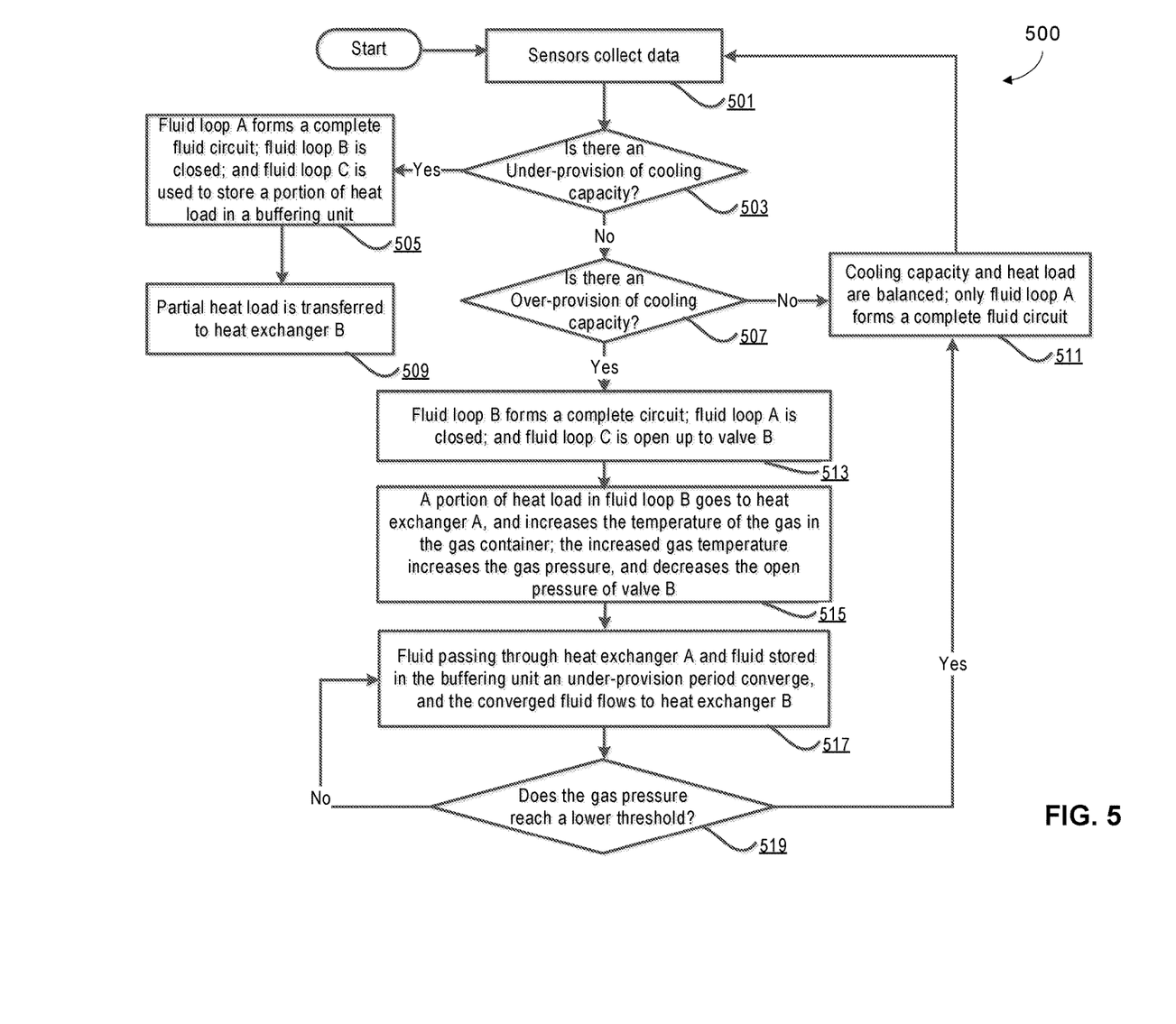
FIG. 5 is a diagram illustrating a process of buffering cooling capacity variations in a cooling system according to one embodiment.

FIG. 5 is a diagram illustrating a process of buffering cooling capacity variations in a cooling system according to one embodiment. As shown in FIG. 5, in block 501, one or more sensors and/or system functions are used to determine whether a cooling system in an under-provision period or over-provision period. The sensors can collect data for the system functions to make the determination in accordance with some predetermined rules.

In block 503, the cooling system makes the determination based on the collected data. In block 505, the cooling system determines that there is an under provision of cooling capacity (i.e., the cooling system in an under-provision period). In such a case, fluid loop A forms a complete fluid circuit, fluid loop B is closed, and fluid loop C is used to store a portion of heat load in a buffering unit.

In block 509, while a portion of heat load is being stored to the buffering unit, a portion of the fluid can flow to heat exchanger B through fluid loop A, and the heat in the fluid can then be transferred to heat exchanger B. The storing of fluid can be stopped when the gas pressure in the buffering unit reaches a lower threshold as a result of the increased fluid volume in the buffering unit.

In block 507, if the cooling system is not in an under-provision period, the cooling system can determine whether it is in an over-provision period or in a period in which the cooling capacity and the heat removal requirement are balanced.

In block 511, when there is a balance between the cooling capacity and the heat removal requirement, only fluid loop A is open to form a complete fluid circuit, while fluid loops B and C are closed because the cooling system does not need the buffering unit in this period. The cooling system then start to collect sensor data 501 again in a new cycle to detect if balance between the cooling capacity and the heat removal requirement is broken.

In block 513, the cooling system is in an over-provision period, during which fluid loop B is open to form a complete fluid circuit, fluid loop A is closed, and fluid loop C is open up to valve B.

In block 515, while fluid passes through heat exchanger A in the gas container, gas in the gas container can be heated up, which causes gas pressure in the gas container to increase to a higher threshold. When the higher threshold is reached, fluid stored in the fluid container during the under-provision period can be forced out due to the increased pressure from the gas container. Meanwhile, valve B can be turned on to allow the forced-out fluid to be discharged.

In block 517, the fluid forced out of the fluid container can converge with fluid in fluid loop B, and the converged fluid can flow to heat exchange B.

In block 519, the cooling system can determine if the gas pressure has deceases below the lower threshold, at which point the discharging will be stopped, and valve B will be turned off. However, if the gas pressure is maintained at the lower threshold, a balance between the cooling capacity and the heat removal requirement is reached.

Figure 6:
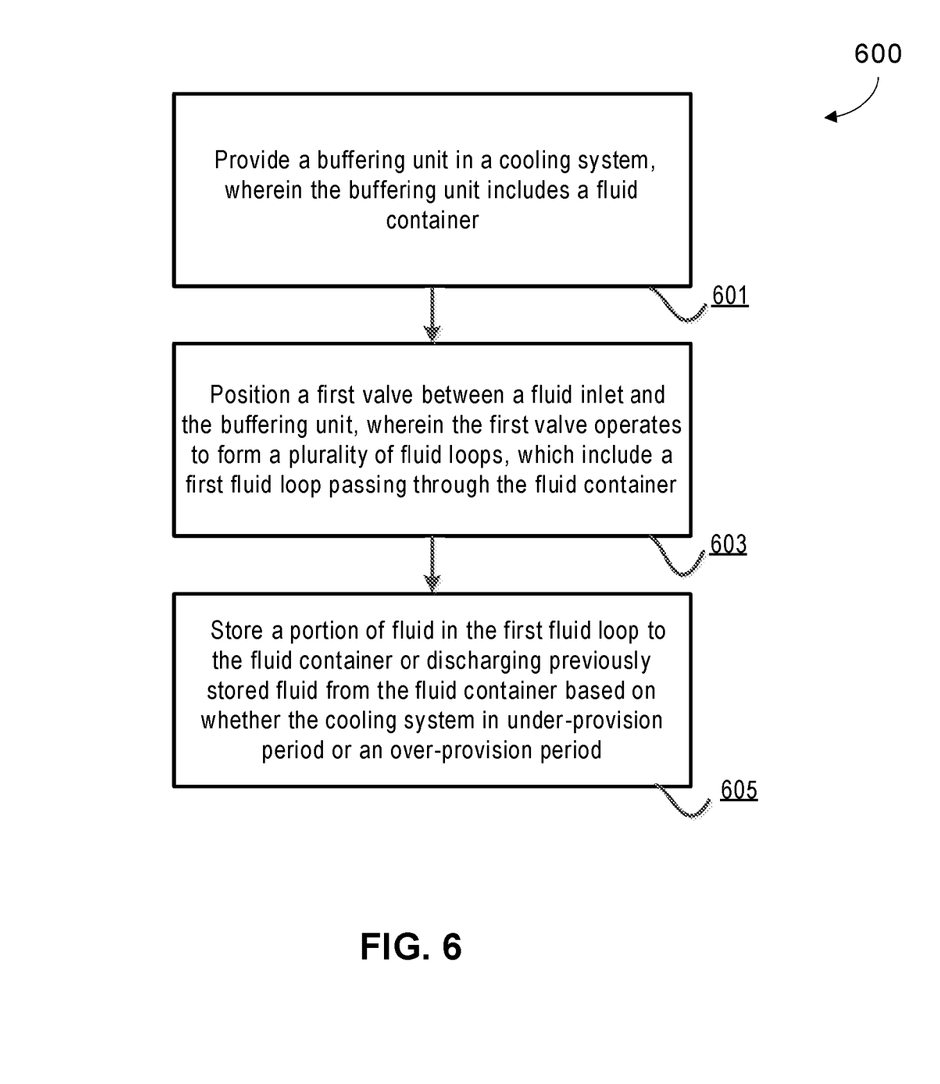
FIG. 6 illustrates a process of buffering cooling capacity variations in a cooling system according to one embodiment.

FIG. 6 illustrates a process of buffering cooling capacity variations in a cooling system according to one embodiment. In block 601, a buffering unit is provided in a cooling system. The buffering unit includes a fluid container, and a gas container. The fluid container and the gas container is separated by an adjustable physical layer, which make both containers expandable. In block 603, a first valve is positioned between a fluid inlet and the buffering unit. The first valve operates to form a plurality of fluid loops, which include a first fluid loop passing through the fluid container. In block 505, a portion of fluid in the first fluid loop is stored to the fluid container or a portion of previously stored fluid in the fluid container is discharged based on whether the cooling system in an under-provision period or an over-provision period.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling system in a data center, comprising:
   a buffering unit including a fluid container; and
   a first valve positioned between a fluid inlet and the buffering unit, the first valve operating to form a plurality of fluid loops, which include a first fluid loop passing through the fluid container;
   wherein the buffering unit stores a portion of fluid in the first fluid loop to the fluid container when the cooling system is in an under-provision period, and discharges previously stored fluid from the fluid container when the cooling system is in an over-provision period.

2. The cooling system of claim 1, wherein the buffering unit further includes a gas container separated from the fluid container by a physical divider, wherein the physical divider is adjustable such that both the gas container and the fluid container are expandable in their sizes.

3. The cooling system of claim 2, wherein the gas container includes a first heat exchanger integrated therewith, and wherein the plurality of fluid loops includes a second medium loop passing through the first heat exchanger.

4. The cooling system of claim 3, further comprising:
a second heat exchanger;
a second valve positioned between the buffering unit and the second heat exchanger;
wherein the buffering unit discharges the stored fluid via the second valve to the second heat exchanger.

5. The cooling system of claim 4, wherein the plurality of fluid loops further includes a second fluid loop and a third fluid loop, wherein the second fluid loop passes through the first heat exchanger, and wherein the third fluid loop directly connects the fluid inlet and the second heat exchanger.

6. The cooling system of claim 5, wherein in the under-provision period, the first fluid loop is open up to the second valve the second fluid loop is closed, and the third fluid loop is open to form a complete fluid circuit.

7. The cooling system of claim 6, wherein the portion of fluid stored to the fluid container adds to existing fluid in the fluid container, causing a volume of fluid in the fluid container to increase.

8. The cooling system of claim 7, wherein the increased volume pushes the physical divider towards the gas container which functions as a shrinkable buffering unit, causing a pressure of gas in the gas container to increase.

9. The cooling system of claim 8, wherein the first valve closes the first fluid loop when the pressure of the gas in the gas container reaches a first threshold.

10. The cooling system of claim 6, wherein fluid in the third fluid loop flows to the second heat exchanger, where the fluid is cooled by a primary loop and then returns to an information technology (IT) server or an IT rack.

11. The cooling system of claim 5, wherein in the over-provision period, the first fluid loop is open up to the second valve, the second fluid loop is open to form a complete fluid circuit, and the third fluid loop is closed.

12. The cooling system of claim 11, wherein fluid in the second fluid loop heats up gas in the gas container to cause a pressure of the gas in the gas container to increase to a second threshold.

13. The cooling system of claim 12, wherein in response to the pressure of the gas reaching the second threshold, the buffering unit turns on the second valve, and pushes towards the fluid container to force out a portion of the stored fluid.

14. The cooling system of claim 13, wherein the forced-out fluid passes through the turned-on second valve, and converge with fluid from the second fluid loop, wherein the converged fluid passes through the second heat exchange and returns to an information technology (IT) server or an IT rack.

15. The cooling system of claim 14, wherein fluid entering into the cooling system from the information technology (IT) server or the IT rack is vapor, wherein at least a portion of the vapor rises up to the second heat exchanger, which condenses the at least portion of the vapor to cooling liquid, which falls into the IT server or the IT rack due to gravity.

16. The cooling system of claim 14, wherein fluid entering into the cooling system from the information technology (IT) server or the IT rack is cooling liquid, wherein at least a portion of the cooling liquid is pushed up by a pump to the second heat exchanger, where the at least portion of the cooling liquid is cooled by a primary loop, and falls into the IT server or the IT rack due to gravity.

17. The cooling system of claim 4, wherein one or more pumps are to be positioned on either side of the second heat exchanger to move fluid through the second heat exchanger.

18. The cooling system of claim 1, wherein a discharging section of the first fluid loop has a larger diameter than the rest of the first fluid loop, or is positioned in an inclined manner, to facilitate discharging of stored fluid in the fluid container.

19. The cooling system of claim 1, wherein the buffering unit includes a pressure sensor for measuring gas pressure in the buffering unit.

20. A method of cooling a data center, comprising:
providing a buffering unit in a cooling system, wherein the buffering unit includes a fluid container;
positioning a first valve between a fluid inlet and the buffering unit, wherein the first valve operates to form a plurality of fluid loops, which include a first fluid loop passing through the fluid container;
storing a portion of fluid in the first fluid loop to the fluid container or discharging previously stored fluid from the fluid container based on whether the cooling system is in an under-provision period or an over-provision period.

* * * * *